United States Patent
Parik et al.

(10) Patent No.: US 9,891,853 B1
(45) Date of Patent: Feb. 13, 2018

(54) MEMORY CALIBRATION ABORT

(71) Applicant: Apple Inc., Cupertino, CA (US)

(72) Inventors: Neeraj Parik, San Jose, CA (US); Gurjeet S. Saund, Saratoga, CA (US); Rakesh L. Notani, Sunnyvale, CA (US); Robert E. Jeter, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 61 days.

(21) Appl. No.: 15/000,626

(22) Filed: Jan. 19, 2016

(51) Int. Cl.
*G06F 3/06* (2006.01)
*G11C 7/22* (2006.01)
*G06F 13/16* (2006.01)

(52) U.S. Cl.
CPC .......... *G06F 3/0629* (2013.01); *G06F 3/0604* (2013.01); *G06F 3/0673* (2013.01); *G06F 13/1689* (2013.01); *G11C 7/222* (2013.01); *G11C 2207/2254* (2013.01)

(58) Field of Classification Search
CPC ... G06F 13/1689; G11C 7/22; G11C 2207/22; G11C 2207/2254; H04L 7/033
See application file for complete search history.

(56) References Cited

U.S. PATENT DOCUMENTS

| | | | |
|---|---|---|---|
| 7,872,494 B2 | 1/2011 | Welker et al. | |
| 8,121,237 B2 | 2/2012 | Stott et al. | |
| 8,681,839 B2 | 3/2014 | Bulzacchelli et al. | |
| 9,025,399 B1 | 5/2015 | Morris et al. | |
| 2006/0012505 A1* | 1/2006 | Lin | H03M 1/1033 341/155 |
| 2009/0110116 A1* | 4/2009 | Hollis | H04L 25/061 375/317 |
| 2011/0066798 A1* | 3/2011 | Kaiwa | G11C 7/04 711/106 |
| 2011/0283060 A1* | 11/2011 | Ware | G06F 13/1636 711/106 |
| 2012/0155526 A1* | 6/2012 | Ware | H04L 7/0091 375/224 |
| 2013/0155788 A1* | 6/2013 | Brandl | G11C 29/021 365/189.011 |
| 2013/0301368 A1* | 11/2013 | Bansal | G11C 7/222 365/194 |
| 2014/0281653 A1 | 9/2014 | Gilda et al. | |

* cited by examiner

Primary Examiner — Edward Dudek, Jr.
Assistant Examiner — Andrew Russell
(74) Attorney, Agent, or Firm — Meyertons, Hood, Kivlin, Kowert & Goetzel, P.C.; Erik A. Heter

(57) ABSTRACT

A method and apparatus for selective calibrations of a memory subsystem is disclosed. The memory subsystem includes a memory and a memory controller. The memory controller is configured to periodically perform calibrations of a data strobe signal conveyed to the memory and a reference voltage used to distinguish between a logic 0 and a logic 1. The memory subsystem is also coupled to receive a clock signal (e.g., at the memory controller). If a pending change of frequency of the clock signal is indicated to the memory controller during performance of a periodic calibration, the reference voltage calibration may be aborted prior to or during the performance thereof, while the data strobe calibration may be completed.

14 Claims, 4 Drawing Sheets

MEMORY CALIBRATION ABORT

BACKGROUND

Technical Field

This disclosure is directed to memory subsystems, and more particularly, calibration of data strobe signals in memory subsystems.

Description of the Related Art

Eye patterns, or eye diagrams, are graphic illustrations that illustrate times and amplitudes at which a digital signal can be sampled at its correct value. In various types of systems that include data transmissions, sampling of signals (based on a clock signal) near a center of an eye, in terms of time, may be desirable. This may provide a signal with a sufficient amount of both setup and hold time, while also rendering it less susceptible to noise. In sampling a signal, a threshold voltage is used to determine whether the signal is interpreted as a logic 0 or a logic 1.

In memory systems, calibrations may be performed to determine the points at which signals are sampled within the eye pattern. Calibrations may be performed to determine both the point in time at which signals are sampled, as well as to determine the threshold voltage for distinguishing between logic 0's and logic 1's. The calibration to determine the point in time at which signals are sampled may be referred to as a horizontal calibration. The calibration to determine the threshold voltage may be referred as a vertical calibration. In many memory systems, these calibration are performed at regular intervals, and typically, in conjunction with one another.

SUMMARY

A method and apparatus for selective calibrations of a memory subsystem is disclosed. In one embodiment, a memory subsystem includes a memory and a memory controller. The memory controller is configured to periodically perform calibrations of a data strobe signal conveyed to the memory and a reference voltage used to distinguish between a logic 0 and a logic 1. The memory subsystem is also coupled to receive a clock signal (e.g., at the memory controller). If a pending change of frequency of the clock signal is indicated to the memory controller during performance of a periodic calibration, the reference voltage calibration may be aborted prior to or during the performance thereof, while the data strobe calibration may be completed.

In one embodiment, the memory controller includes circuitry for tracking the number of times the reference voltage calibration has previously been aborted. This number may be compared to a threshold value. If a pending change of frequency is indicated to the memory controller, it may first compare the number of previous aborts to the threshold value before aborting the reference voltage calibration. If the number of previous aborts is less than the threshold value, the memory controller may abort the reference voltage calibration responsive to the present indication of a clock frequency change. If the number of previous aborts is not less than the threshold value, the memory controller may instead fully perform the reference voltage calibration. The threshold value is programmable per frequency mode. For example, threshold value of 0 in one embodiment means always abort while threshold value of 32'hFFFFFFFF of the same embodiment means never abort.

BRIEF DESCRIPTION OF THE DRAWINGS

The following detailed description makes reference to the accompanying drawings, which are now briefly described.

Figure 1:
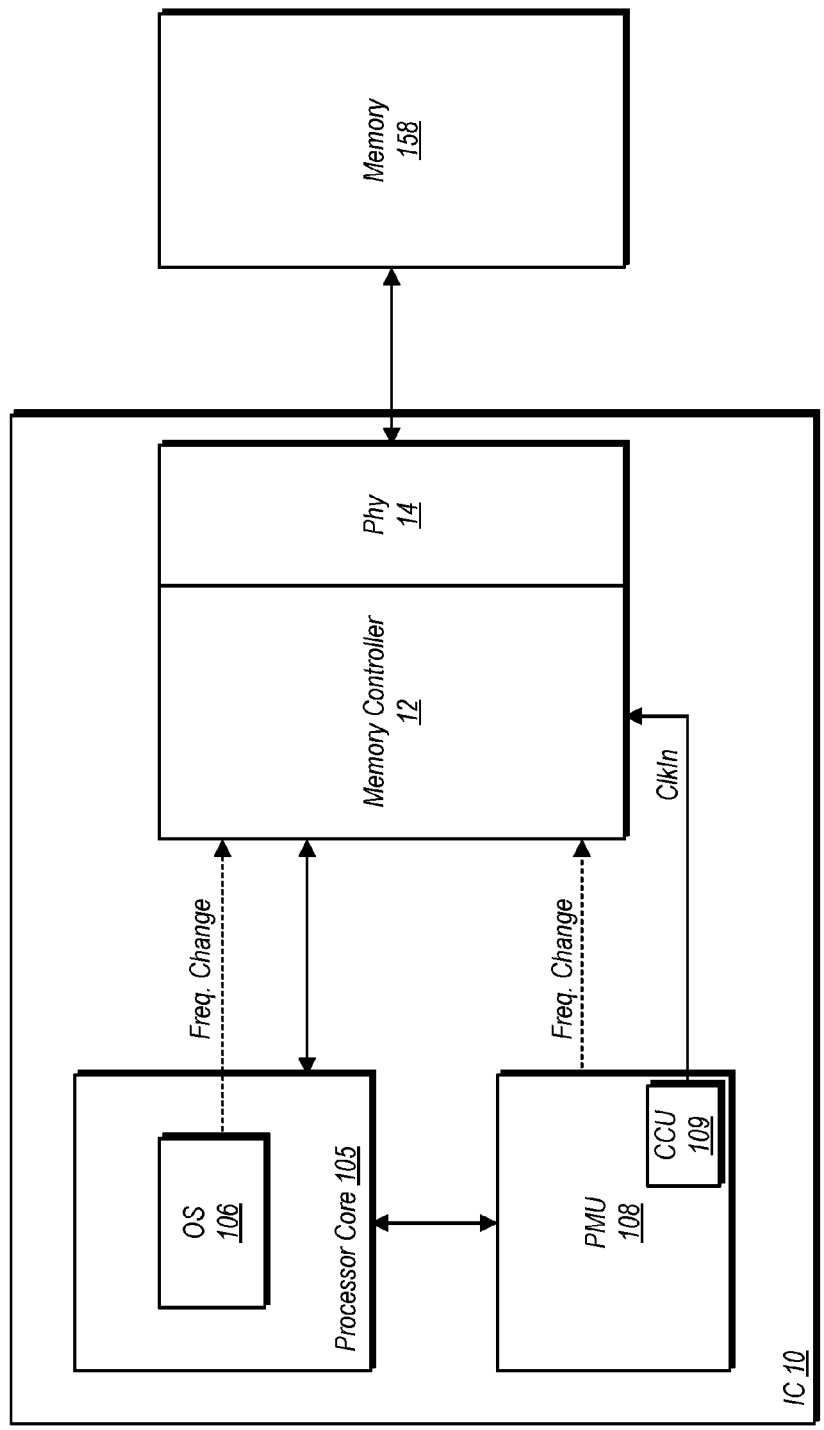
FIG. 1 is a block diagram of one embodiment of an integrated circuit and a memory coupled thereto.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) (or pre-AIA paragraph six) interpretation for that unit/circuit/component.

DETAILED DESCRIPTION OF EMBODIMENTS

FIG. 1 is a block diagram of one embodiment of an integrated circuit (IC). IC 10 is shown here as a simplified block diagram including various units/circuits implemented thereon. However, other embodiments are possible and contemplated, and may include additional circuits/units not shown here or explicitly discussed herein.

In the embodiment shown, IC 10 is coupled to a memory 158. In one embodiment, memory 158 is a dynamic random access memory (DRAM), although the scope of this disclosure is not limited to DRAM.

IC 10 in the embodiment shown includes at least one processor core 105, although multiple instances of the same may be present. Processor core 105 is configured to execute software instructions, including those of operating system (OS) 105. The instructions of OS 105 may, when executed, cause various system management functions to be performed, such as memory allocation, performance state changes, and so forth.

IC 10 also includes a power management unit (PMU) 108 in the illustrated embodiment. PMU 108 may implement circuitry that performs various power control functions, such as supply voltage changes, power gating, clock frequency changes, and clock gating. These power control functions may be performed in conjunction with performance state changes. Such performance state changes may be put into effect via execution of instructions of OS 105 or through other mechanisms within PMU 108 itself.

PMU 108 in the illustrated embodiment includes a clock control unit (CCU) 109. A clock signal, ClkIn, may be provide from CCU 109 to a memory controller 12 of IC 10. This clock signal may be generated internal to CCU 109, or by other clock generation circuitry external thereto.

Memory controller 12, in conjunction with physical interface (PHY) 14, provides an interface between processor core 105 and memory 158. Although not explicitly shown, IC 10 may also include one or more units of interface circuitry that are also coupled to memory controller 12. Accordingly, memory controller 12 may provide an interface for one or more circuits external to IC 10 and memory 158.

During operation, memory controller 12 may operate in a number of different performance states. The different performance states may in turn utilize different frequencies for ClkIn with respect to one another. In some embodiments, the decision to change the frequency of ClkIn may be made by OS 106. In other embodiments, the decision may be made by PMU 108. In the case in which OS 106 controls the decision to change the frequency of ClkIn, it may provide an indication of a pending clock frequency change to memory controller 12. PMU 108 may provide the frequency change indication in embodiments in which it makes the decision to change the clock frequency. Memory controller 12 may use the information of the pending clock frequency change to perform certain actions. As is discussed below, memory controller 12 may take action with regard to certain periodic calibration if the indication of a pending frequency change is received during the performance thereof.

Figure 2:
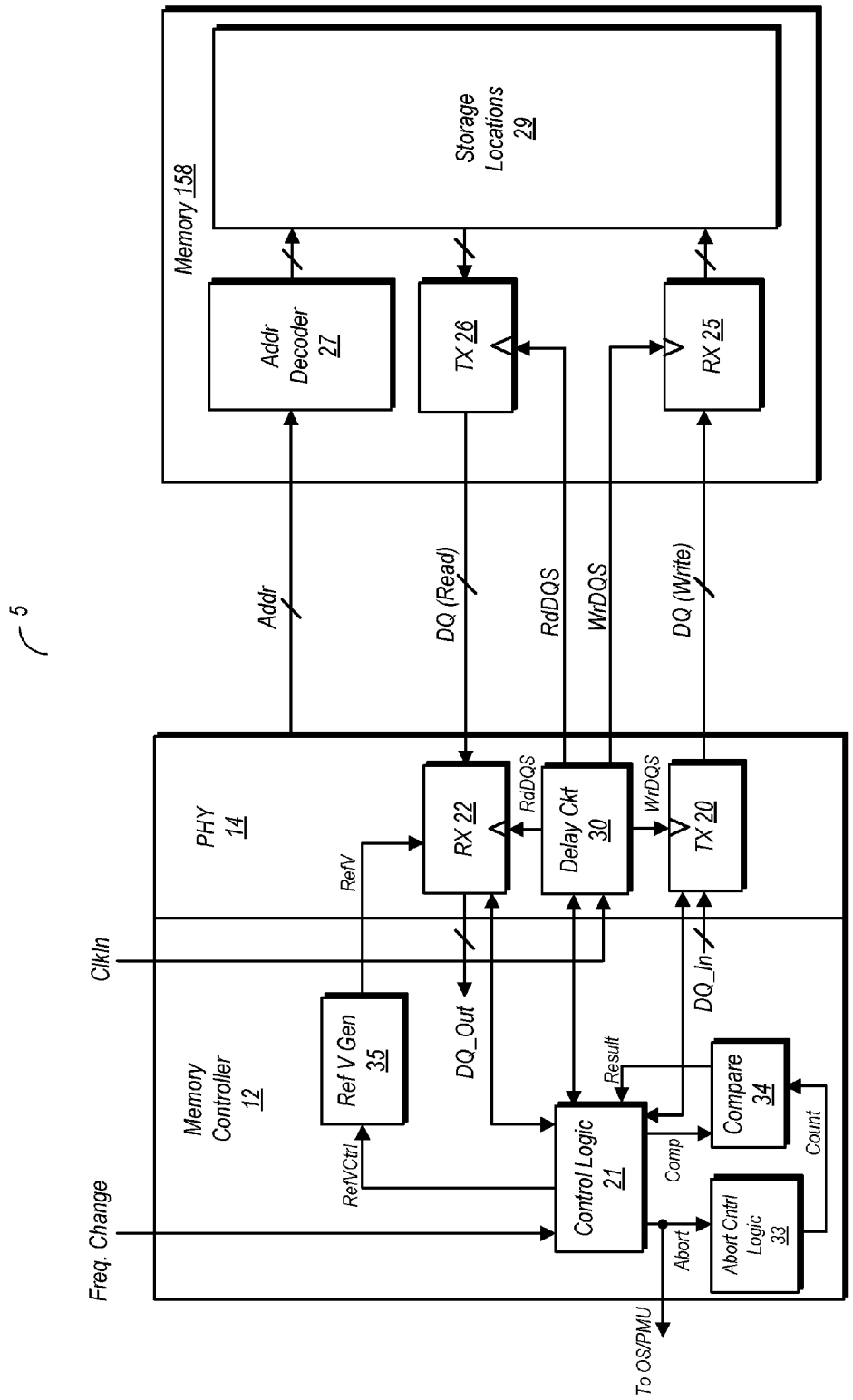
FIG. 2 is a block diagram of one embodiment of a memory subsystem.

Turning now to FIG. 2, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver 22 configured to receive data read from memory 158, and a transmitter 20 configured to transmit data to memory 158. Memory 158 includes an address decoder 27, a number of storage locations 29, a receiver 25 configured to receive data to be written and a transmitter 26 configured to transmit data that has been read. Although not explicitly shown, memory 158 may include additional logic for receiving read and write enable signals, with such logic being configured to enable selected storage locations for read and write operations, respectively. Additionally, memory controller 12 in the embodiment shown includes control logic 21, which may perform various functions, including conducting various embodiments of a calibration method discussed below.

Physical layer 14 includes a delay circuit 30 that is coupled to receive an input clock signal ('Clk'). In the embodiment shown, delay circuit 30 may include two separate paths to apply delays to the input clock signal to generate a read data strobe ('RdDQS') and a write data strobe ('WrDQS'). For example, one embodiment of delay circuit 30 may include a pair of delay locked loops (DLLs), one configured to output the read data strobe and one to output the write data strobe. The delays of the respective DLL's may be set according to control signals generated elsewhere in memory controller 12, e.g., in control logic 21. Types of delay circuits other than DLL's are also possible and contemplated for various other embodiments.

Delay circuit 30 may provide the read data strobe to receiver 22 in physical layer 14, as well as to transmitter 26 in memory 158. The read data strobe signal may be used in synchronizing reads of memory 158. The write data strobe may be provided to transmitter 20 of physical layer 14, along with receiver 25 of memory 158. Accordingly, the write data strobe may be used in synchronizing writes to memory 158.

Memory 158 in the embodiment shown includes an address decoder 27 coupled to receive an address from physical layer 14 of memory controller 12. Address decoder 27 may decode the received address to enable particular ones of the storage locations 29 that are to be enabled for a current memory operation. Addresses may be provided from physical layer 14 of memory controller 12 for both read operation and write operations.

The data strobe signals provided by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram. Accordingly, calibration procedures may be performed at certain times during operation of memory controller 12 in order to optimize the point in time at which the data strobe signals sample data. The calibration procedures may be conducted under the control of control logic 21, and involved performing a number of reads of from memory along with adjustments of an amount of delay applied to the data strobe signal being calibrated. The calibration of the data strobe delay may be performed periodically, and may sometimes be referred to as a horizontal calibration.

A reference voltage calibration may also be performed under the control of control logic 21. The reference voltage may be that voltage that is used to distinguish between a logic 0 and a logic 1. Over time, due to process, voltage, and temperature variations, the reference voltage may need to be calibrated. This calibration may also be performed periodically, and may sometimes be referred to as a vertical calibration. Based on the calibration, control logic 21 may set the reference voltage at reference voltage generator 35 using the signal RefVCtrl. The reference voltage, RefV, or an indication of the same, may be provided from reference voltage generator 35 to receiver 22.

In one embodiment, the horizontal and vertical calibrations may be performed at the same periodic intervals, with one being performed on an interval just after completing the other. The vertical calibration may require a significantly greater amount of time to complete than the horizontal calibration. This can cause performance issues if memory controller 12 receives an indication of a pending frequency while the calibrations are being performed. In particular, the performance of the vertical calibration can result in a significant delay in changing the performance state. Accordingly, memory controller 12 in the embodiment shown is arranged to, in some instances, abort the vertical calibration if an indication of a pending frequency change is received. Aborting the reference voltage calibration may occur during or prior to the performance thereof. Irrespective of whether a frequency change indication is receive, the horizontal calibration may be completed, since the amount of time to perform does not significantly delay entry into the new performance state.

Aborting the reference voltage calibration implies that, after some amount of time, the reference voltage value is stale. Accordingly, in some instances, the reference voltage calibration may be performed even when an indication of a pending frequency change is received. In the embodiment shown, memory controller 12 includes a abort control logic 33 and a comparator 34 which may operate to determine whether a vertical calibration is aborted in a specific instance. Abort control logic 33 may implement a counter and may store a value indicating a number of times that the vertical calibration has been aborted since its most recent previous performance. This counter may be incremented each time the vertical calibration is aborted.

Responsive to receiving an indication of a pending frequency change, control logic 21 may direct comparator 34 to read the current value stored in abort control logic 33 and compare it to a threshold value. Comparator 34 may return the result to control logic 21. If the count value stored in abort control logic 33 is less than a threshold value, control logic 21 may cause the vertical calibration to be aborted, and may increment the abort control logic using the Abort signal. The asserted Abort signal may also be provided to either the OS (via the processor) and/or the PMU. If the count value stored in abort control logic 33 is not less than the threshold value, control logic 21 may instead allow the vertical calibration to be fully performed. Control logic 21 may also reset the abort control logic 33 when a vertical calibration is allowed to be fully performed as a result of the count value not being less than the threshold. Additionally, abort control logic 33 may be reset if a vertical calibration is performed between changes to the frequency of the clock signal, ClkIn.

In some instances of operation, the OS or the PMU may cause changes to occur at fairly regular intervals. It is possible that these intervals may largely coincide with the periodic calibrations. Accordingly, if the Abort signal is asserted, indicating an abort, the OS or PMU (depending on which one is controlling the performance state) may alter the spacing/timing of the intervals. This may prevent the intervals of performance state changes from coinciding with the calibrations, and thereby not interfere with performance of the vertical calibration.

Figure 3:
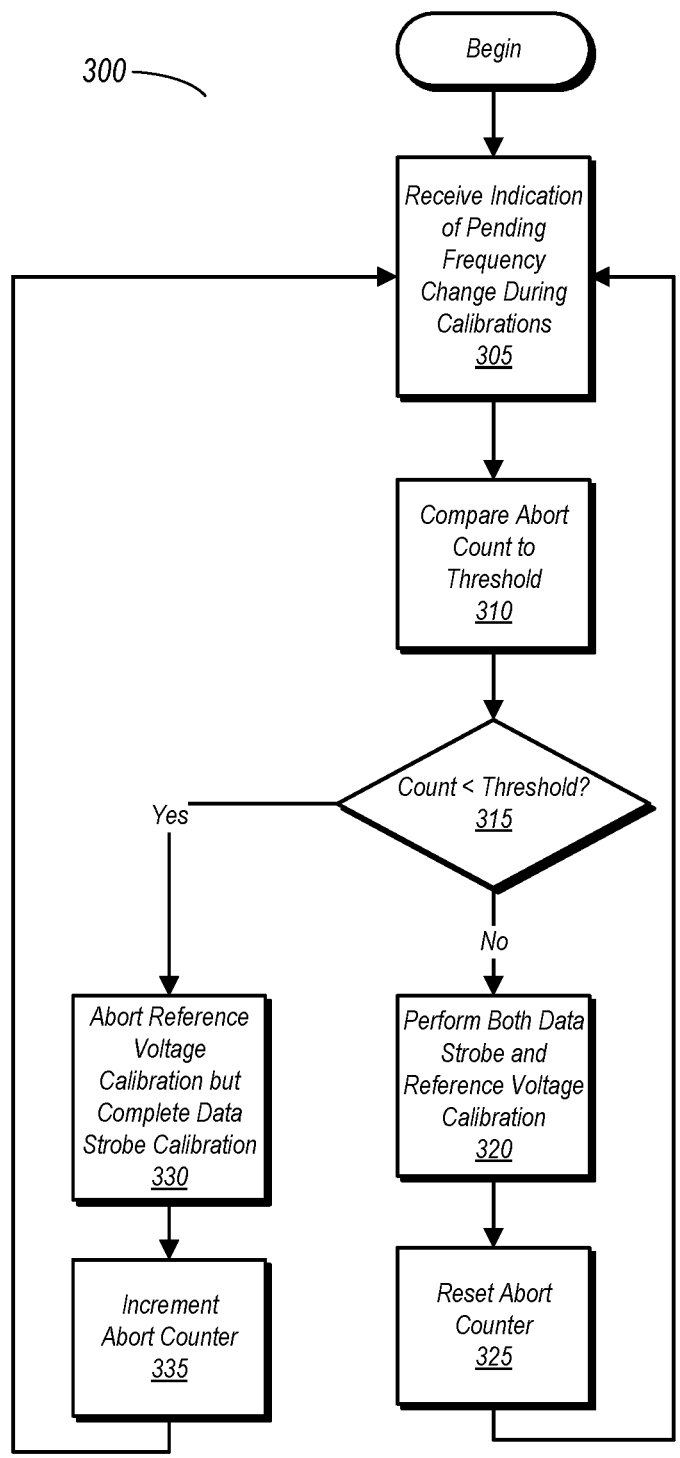
FIG. 3 is a flow diagram illustrating one embodiment of a method for operating a memory subsystem.

FIG. 3 is a flow diagram illustrating one embodiment of a method for operating a memory subsystem. Method 300 as shown herein may be performed using various apparatus/software embodiments as discussed above. Additionally, it is possible and contemplated that method 300 may be performed with other hardware/software/firmware embodiments not explicitly discussed herein.

Method 300 begins with the receipt of an indication of a pending clock frequency change concurrent with the performing of periodic calibrations in the memory subsystem (block 305). The calibrations are the horizontal and vertical calibrations (i.e. data strobe delay and reference voltage, respectively) as discussed above. Responsive to receiving the indication of the pending frequency change, circuitry in the memory controller may perform a comparison of an abort count value to a threshold value (block 310). The abort count value may be an indication of a number of times that the vertical calibration has been aborted since it was most recently performed in full.

If the abort count value is less than the threshold value (block 315, yes), then the vertical calibration may be aborted, while the horizontal calibration may be performed to completion (block 330). The aborting of the vertical calibration may be performed prior to beginning or after the procedure is already underway. Responsive to the decision to abort the vertical calibration, the abort counter may be incremented (block 335).

If the abort count value is not less than the threshold (block 315, no), then both the vertical and horizontal calibrations are performed in full, irrespective of the pending clock frequency change (block 320). After performing both calibrations, the abort counter is reset to a value of zero (block 325).

Figure 4:
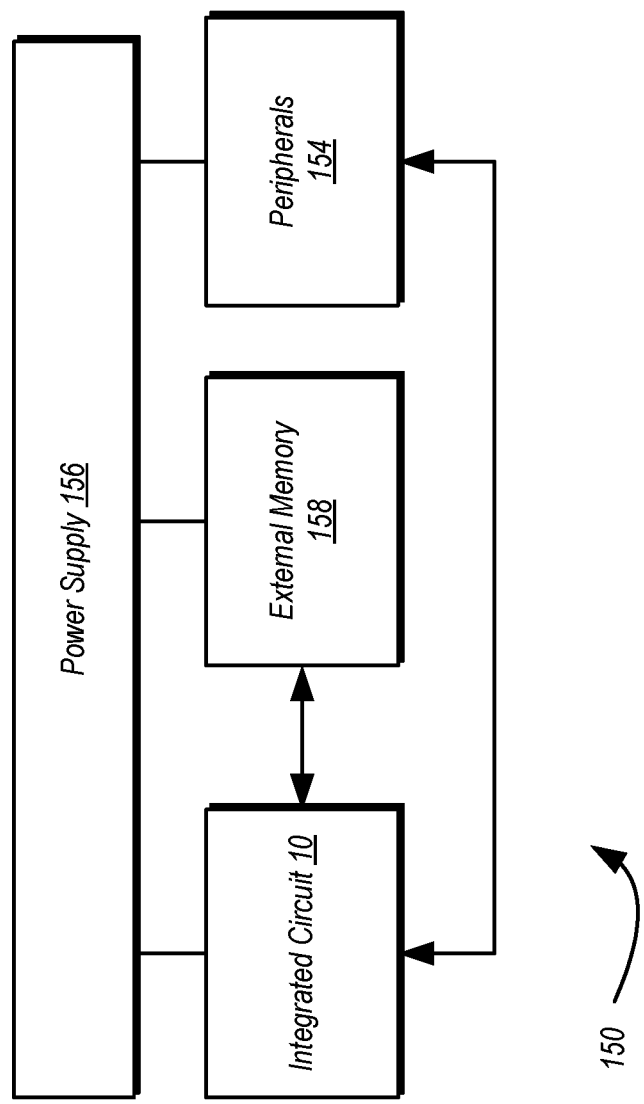
FIG. 4 is a block diagram of one embodiment of an exemplary system.

Turning next to FIG. 4, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAIVIBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
a memory subsystem including a memory controller and a memory coupled to the memory controller;
wherein the memory controller is configured to periodically perform a data strobe calibration to calibrate a data strobe signal used to synchronize data transferred between the memory controller and the memory, and a reference voltage calibration to calibrate a voltage which is used to distinguish whether a bit read from the memory is a logic one or a logic zero;
wherein, responsive to receiving an indication of a pending change of operating clock frequency of the memory subsystem, the memory controller is configured compare a first value to a threshold value, wherein the first value indicates a number of times that the reference voltage calibration has previously been aborted, and further configured to abort the reference voltage calibration while completing the data strobe calibration if the first value is less than the threshold value; and
wherein, responsive to an abort of the reference voltage calibration, the memory controller is configured to provide an indication of the abort to operating system software, and wherein the operating system software is configured to cause a change of a spacing of intervals at which the operating clock frequency is changed responsive to receiving the indication.

2. The apparatus as recited in claim 1, wherein the memory controller is further configured to complete both the reference voltage calibration and the data strobe calibration if the first value is equal to the threshold value.

3. The apparatus as recited in claim 2, wherein the memory controller is configured to reset the first value to zero responsive to determining that the first value is equal to the threshold value.

4. The apparatus as recited in claim 1, wherein the memory controller is configured to increment the first value responsive to aborting the reference voltage calibration.

5. The apparatus as recited in claim 1, wherein the memory controller is configured to perform data strobe calibration in a first amount of time and further configured to perform the reference voltage calibration in a second amount of time, wherein the second amount of time is greater is than the first amount of time.

6. A method comprising:
initiating, at a memory controller, a calibration of a memory subsystem including a memory and the memory controller, wherein the memory calibration includes a data strobe calibration to calibrate a data strobe signal used to synchronize data transferred between the memory controller and the memory, and a reference voltage calibration to calibrate a voltage which is used to distinguish whether a bit read from the memory is a logic one or a logic zero;
receiving an indication of a pending change of operating frequency of a clock signal provided to the memory subsystem;
comparing, responsive to receiving the indication, a first value to a threshold value, wherein the first value indicates a number of times that the reference voltage calibration has previously been aborted;
aborting the reference voltage calibration while completing the data strobe calibration if the first value is less than the threshold value;
the memory controller providing, responsive to an abort of the reference voltage calibration, an indication of the abort to operating system software; and
the operating system software causing a change of a spacing of intervals at which the operating clock frequency is changed responsive to receiving the indication.

7. The method as recited in claim 6, further comprising completing both the reference voltage calibration and the data strobe calibration if the first value is greater than or equal to the threshold value.

8. The method as recited in claim 7, further comprising resetting the first value to zero responsive to determining that the first value is equal to the threshold value.

9. The method as recited in claim 6, further comprising incrementing the first value responsive to aborting the reference voltage calibration.

10. The method as recited in claim 6, wherein the data strobe calibration is performed in a first amount of time and the reference voltage calibration is performed in a second amount of time, wherein the second amount of time is greater is than the first amount of time.

11. A system comprising:
an integrated circuit including a memory controller;
a memory coupled to the memory controller of the integrated circuit;
wherein the memory controller is configured to periodically perform a data strobe calibration to calibrate a data strobe signal used to synchronize data transferred between the memory controller and the memory, and a reference voltage calibration to calibrate a voltage which is used to distinguish whether a bit read from the memory is a logic one or a logic zero;
wherein, responsive to receiving an indication of a pending change of operating clock frequency, the memory controller is configured to compare a first value to a threshold value, wherein the first value indicates a number of times that the reference voltage calibration has previously been aborted, wherein the memory controller is configured to abort the reference voltage calibration while completing the data strobe calibration if the first value is less than the threshold value and further configured to complete both the reference voltage calibration and the data strobe calibration if the first value is equal to the threshold value; and
wherein the integrated circuit includes a processor configured to execute instructions of an operating system, wherein, responsive to an abort of the reference voltage calibration, the memory controller is configured to provide an indication of the abort to the operating system, and wherein the processor is further configured to execute instructions of the operating system to cause a change of a spacing of intervals at which the operating clock frequency is changed responsive to receiving the indication.

12. The system as recited in claim 11, wherein the integrated circuit includes a power management circuit configured to cause a change to the operating clock frequency, wherein, responsive to an abort of the reference voltage calibration, the memory controller is configured to provide an indication of the abort to the power management circuit, and wherein the power management circuit is configured to cause a change a spacing of intervals at which the operating clock frequency is changed responsive to receiving the indication.

13. The system as recited in claim 11, wherein the memory controller is configured to perform data strobe calibration in a first amount of time and further configured to perform the reference voltage calibration in a second amount of time, wherein the second amount of time is greater is than the first amount of time.

14. The system as recited in claim 11, wherein the memory controller is configured to reset the first value to zero responsive to determining that the first value is equal to the threshold value.

* * * * *